United States Patent
Eckel et al.

(10) Patent No.: US 10,408,997 B1
(45) Date of Patent: Sep. 10, 2019

(54) NET SHAPE CERAMIC MICROTRUSS AND CERAMIC MICROTRUSS WITH METAL SHELL

(71) Applicant: HRL LABORATORIES, LLC, Malibu, CA (US)

(72) Inventors: Zak C. Eckel, Thousand Oaks, CA (US); Tobias A. Schaedler, Oak Park, CA (US); Alan J. Jacobsen, Woodland Hills, CA (US); Chaoyin Zhou, Chino Hills, CA (US); John H. Martin, Ventura, CA (US)

(73) Assignee: HRL Laboratories, LLC, Malibu, CA (US)

( * ) Notice: Subject to any disclaimer, the term of this patent is extended or adjusted under 35 U.S.C. 154(b) by 642 days.

(21) Appl. No.: 14/964,273

(22) Filed: Dec. 9, 2015

Related U.S. Application Data

(60) Provisional application No. 62/092,733, filed on Dec. 16, 2014, provisional application No. 62/128,410, filed on Mar. 4, 2015.

(51) Int. Cl.
| | | |
|---|---|---|
| *G02B 6/12* | (2006.01) | |
| *C23C 14/02* | (2006.01) | |
| *C23C 14/34* | (2006.01) | |
| *C23C 22/83* | (2006.01) | |
| *C23C 16/00* | (2006.01) | |
| *C23C 14/00* | (2006.01) | |
| *G03F 7/20* | (2006.01) | |
| *G02B 6/122* | (2006.01) | |
| *G02B 6/132* | (2006.01) | |

(52) U.S. Cl.
CPC ...... *G02B 6/12002* (2013.01); *C23C 14/0021* (2013.01); *C23C 14/02* (2013.01); *C23C 14/028* (2013.01); *C23C 14/34* (2013.01); *C23C 16/00* (2013.01); *C23C 22/83* (2013.01); *G02B 6/1221* (2013.01); *G02B 6/132* (2013.01); *G03F 7/20* (2013.01); *G02B 2006/12197* (2013.01)

(58) Field of Classification Search
CPC ... G02B 6/12002; G02B 6/1221; G02B 6/132
See application file for complete search history.

(56) References Cited

U.S. PATENT DOCUMENTS

| | | |
|---|---|---|
| 3,451,841 A | 6/1969 | Kesten et al. |
| 3,873,350 A | 3/1975 | Dwyer et al. |
| 3,880,969 A | 4/1975 | Latos |
| 4,374,202 A | 2/1983 | Zucker et al. |

(Continued)

OTHER PUBLICATIONS

U.S. Appl. No. 12/506,859 entitled: "Pre-Ceramic Monomer formulations for Making Preceramic Polymer Waveguides" filed Jul. 21, 2009, 33 pages.

*Primary Examiner* — Catherine A. Simone
(74) *Attorney, Agent, or Firm* — Lewis Roca Rothgerber Christie, LLP

(57) ABSTRACT

A ceramic micro-truss structure. In one embodiment green state polymer micro-truss structure is formed by exposing a photomonomer resin through a mask to collimated light from three or more directions. The green state polymer micro-truss structure is shaped and post-cured to form a cured polymer micro-truss structure. The cured polymer micro-truss structure is pyrolyzed to form a ceramic micro-truss structure, which may subsequently be coated with metal.

10 Claims, 17 Drawing Sheets

(56) References Cited

U.S. PATENT DOCUMENTS

| | | |
|---|---|---|
| 4,889,670 A | 12/1989 | Gurak et al. |
| 4,981,820 A | 1/1991 | Renlund et al. |
| 5,643,512 A | 7/1997 | Daws et al. |
| 6,635,339 B1 | 10/2003 | Adler et al. |
| 7,382,959 B1 | 6/2008 | Jacobsen |
| 7,687,132 B1 * | 3/2010 | Gross ................... B22F 1/0007 385/129 |
| 2011/0117338 A1 | 5/2011 | Poquette et al. |
| 2013/0143060 A1 | 6/2013 | Jacobsen et al. |

* cited by examiner

NET SHAPE CERAMIC MICROTRUSS AND CERAMIC MICROTRUSS WITH METAL SHELL

CROSS-REFERENCE TO RELATED APPLICATION(S)

The present application claims priority to and the benefit of U.S. Provisional Application No. 62/092,733, filed Dec. 16, 2014, titled "NET SHAPE CERAMIC MICROTRUSS AND CERAMIC MICROTRUSS WITH METAL SHELL", the entire content of which is incorporated herein by reference.

This application also claims priority to and the benefit of U.S. Provisional Application No. 62/128,410, filed Mar. 4, 2015, titled "CELLULAR CERAMIC MATERIALS", the entire content of which is incorporated herein by reference.

This application is also related to and incorporates by reference in their entirety, as if set forth in full, U.S. Pat. No. 7,382,959 ("the '959 patent"), and U.S. patent application Ser. No. 12/506,859, filed Jul. 21, 2009, entitled "PRE-CERAMIC MONOMER FORMULATIONS FOR MAKING PRECERAMIC POLYMER WAVEGUIDES" ("the '859 Application").

STATEMENT REGARDING FEDERALLY SPONSORED RESEARCH OR DEVELOPMENT

This invention was made with U.S. Government support under contract No. W91CRB-10-C-0305. The U.S. Government has certain rights in this invention.

BACKGROUND

1. Field

One or more aspects of embodiments according to the present invention relate to cellular materials, and more particularly to a ceramic micro-truss cellular material.

2. Description of Related Art

In many, e.g., aerospace or automotive, applications, high strength, lightweight structural materials able to withstand high temperatures are required. In certain applications, such as in covering the exterior surface of an aircraft, a material that can be formed to a curved surface, preferably without machining, may be needed. Some related art ceramic materials are able to withstand high temperatures, but may be relatively dense and costly to machine. Thus, there is a need for a high strength, lightweight structural material that is able to withstand high temperatures and can readily be fabricated to conform to curved surfaces.

SUMMARY

Aspects of embodiments of the present disclosure are directed toward a ceramic micro-truss structure. In one embodiment, a green state polymer micro-truss structure is formed by exposing a photomonomer resin through a mask to collimated light from three or more directions. The green state polymer micro-truss structure is shaped and post-cured to form a cured polymer micro-truss structure. The cured polymer micro-truss structure is pyrolyzed to form a ceramic micro-truss structure, which may subsequently be coated with metal.

According to an embodiment of the present invention there is provided a micro-truss structure, including: a plurality of first truss members extending along a first direction; and a plurality of second truss members extending along a second direction, wherein the first and second truss members interpenetrate each other at a plurality of nodes to form a continuous material; wherein each of the truss members includes as a major component a ceramic including, as a major component, a combination of at least two elements selected from the group consisting of silicon, carbon, nitrogen, oxygen, boron, and aluminum; and wherein each of the truss members includes an exterior metal coating with a thickness of at least 100 nanometers (nm).

In one embodiment, each of the truss members further includes an additive selected from the group consisting of: yttrium, compounds of yttrium, zirconium, compounds of zirconium, aluminum, compounds of aluminum, titanium, compounds of titanium, high-temperature alloys, ceramics, boron, diamond, silicides, and combinations thereof.

In one embodiment, a cross section of a truss member of the plurality of first truss members and the plurality of second truss members has a cross-sectional shape selected from the group consisting of a circle, a polygon, and an elongated shape with a minor dimension of less than 4 mm.

In one embodiment, a truss member of the plurality of first truss members and the plurality of second truss members has a circular cross section with a diameter between 0.01 mm and 3 mm.

In one embodiment, the ceramic includes, as a major component, a substance selected from the group consisting of silicon, carbon, oxygen, and combinations thereof.

In one embodiment, the ceramic further includes sulfur at a concentration of between 0.01 atomic percent (at. %) and 20 at. %.

In one embodiment, a truss member of the plurality of first truss members and the plurality of second truss members has a diameter greater, by at least 30%, than another truss member of the plurality of first truss members and the plurality of second truss members.

In one embodiment, the micro-truss structure includes a plurality of third truss members extending along a third direction, wherein the first, second, and third truss members interpenetrate each other at a plurality of nodes to form a continuous material.

According to an embodiment of the present invention there is provided a micro-truss structure, including: a plurality of first truss members extending along a first direction; and a plurality of second truss members extending along a second direction, wherein the first and second truss members interpenetrate each other at a plurality of nodes to form a continuous material; wherein each of the truss members includes as a major component a ceramic including, as a major component, a combination of at least two elements selected from the group consisting of silicon, carbon, nitrogen, oxygen, boron, and aluminum; and wherein the structure has an envelope in the shape of a curved sheet, a radius of curvature at a point on the envelope being more than 3 times the thickness of the sheet and less than 100 times the thickness of the sheet.

In one embodiment, a portion of the envelope is conical or tubular.

In one embodiment, the micro-truss structure includes a plurality of third truss members extending along a third direction, wherein the first, second, and third truss members interpenetrate each other at a plurality of nodes to form a continuous material.

According to an embodiment of the present invention there is provided a method for forming a micro-truss structure, the method including: forming a green state polymer micro-truss structure by exposing a volume of photomonomer resin to collimated light through a mask, the green state polymer micro-truss structure including: a plurality of first truss members defined by a plurality of first self-propagating polymer waveguides and extending along a first direction; and a plurality of second truss members defined by a plurality of second self-propagating polymer waveguides and extending along a second direction; the plurality of first truss members and the plurality of second truss members interpenetrating at a plurality of nodes, removing residual photomonomer resin from the green state polymer micro-truss structure; shaping the green state polymer micro-truss structure to form a shaped green state polymer micro-truss structure, the shaping including a process selected from the group consisting of bending, molding, stretching, impressing, embossing and combinations thereof; post-curing the shaped green state polymer micro-truss structure to form a cured polymer micro-truss structure, the post-curing including a process selected from the group consisting of exposing the shaped green state polymer micro-truss to ultraviolet (UV) light, exposing the shaped green state polymer micro-truss to temperatures between 100° C. and 300° C. in an inert environment, and combinations thereof; and pyrolyzing the cured polymer micro-truss structure to form a ceramic micro-truss structure, the pyrolyzing including heating the cured polymer micro-truss structure to a temperature of at least 600° C. in a non-oxidizing environment.

In one embodiment, the method includes: machining the green state polymer micro-truss structure, machining the shaped green state polymer micro-truss structure, or machining the cured polymer micro-truss structure.

In one embodiment, the method includes, as a major component, a combination of argon and nitrogen.

In one embodiment, the mixture of gases has a total absolute pressure less than 0.05 atmosphere.

In one embodiment, the mixture of gases includes oxygen at a partial pressure of no more than 0.01 atmosphere.

In one embodiment, the heating of the cured polymer micro-truss structure includes raising the temperature of the cured polymer micro-truss structure at a rate of no more than 40° C. per minute.

In one embodiment, the pyrolyzing of the cured polymer micro-truss structure includes placing the cured polymer micro-truss structure on a lubricated flat substrate.

In one embodiment, the pyrolyzing of the cured polymer micro-truss structure includes purging the non-oxidizing environment.

In one embodiment, the photomonomer resin includes an additive selected from the group consisting of: yttrium, compounds of yttrium, zirconium, compounds of zirconium, aluminum, compounds of aluminum, titanium, compounds of titanium, high-temperature alloys, ceramics, boron, diamond, silicides, and combinations thereof.

In one embodiment, the method includes depositing a metallic coating on a surface of the ceramic micro-truss structure, wherein the depositing of the metallic coating includes a technique selected from the group consisting of liquid deposition techniques and vapor deposition techniques.

In one embodiment, the method includes depositing a metallic coating on a surface of the ceramic micro-truss structure, wherein the depositing of the metallic coating includes a technique selected from the group consisting of electroplating, electroless plating, sputtering, evaporation, chemical vapor deposition (CVD), chemical vapor infiltration (CVI), and physical vapor deposition (PVD).

In one embodiment, the method includes depositing a metallic coating on a surface of the ceramic micro-truss structure, wherein the depositing of the metallic coating includes: depositing a first layer of metal with a technique selected from the group consisting of electroless plating, sputtering, evaporation, chemical vapor deposition (CVD), chemical vapor infiltration (CVI), and physical vapor deposition (PVD), and depositing a second layer of metal by electroplating.

In one embodiment, the method includes depositing a metallic coating on a surface of the ceramic micro-truss structure.

In one embodiment, the ceramic micro-truss structure includes, sulfur at a concentration of between 0.01 atomic percent (at. %) and 20 at. %.

In one embodiment, the ceramic micro-truss structure includes, as a major component, a combination of elements selected from the group consisting of silicon, carbon, and oxygen.

In one embodiment, the green state polymer micro-truss structure further includes a plurality of third truss members defined by a plurality of third self-propagating polymer waveguides and extending along a third direction, and in the green state polymer micro-truss structure, the plurality of first truss members, the plurality of second truss members, and the plurality of third truss members interpenetrate at a plurality of nodes.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a net shape ceramic micro-truss and ceramic micro-truss with metal shell provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

In one embodiment, the present invention provides a cellular ceramic micro-truss structure that has a secondary non-flat external shape or envelope, and a method for fabricating such a structure. The ceramic material in the structure is derived from pre-ceramic (or "preceramic") precursor monomer formulations or polymeric systems which can be chosen, for example, from those described in the '859 Application. These formulations are cured into a cellular micro-truss material using a waveguide process as described in the '959 Patent. A micro-truss material may have dimensions (e.g. truss element diameters not exceeding 3 mm) that allow gases evolved during pyrolysis (which may be used to derive ceramic from polymer) to diffuse out of the structure; larger dimensions may result in gases accumulating sufficient pressure to fracture the material. The cellular structure is defined by the exposure mask as described in the '959 Patent, which makes it possible to form a well-controlled architecture.

Figure 1:
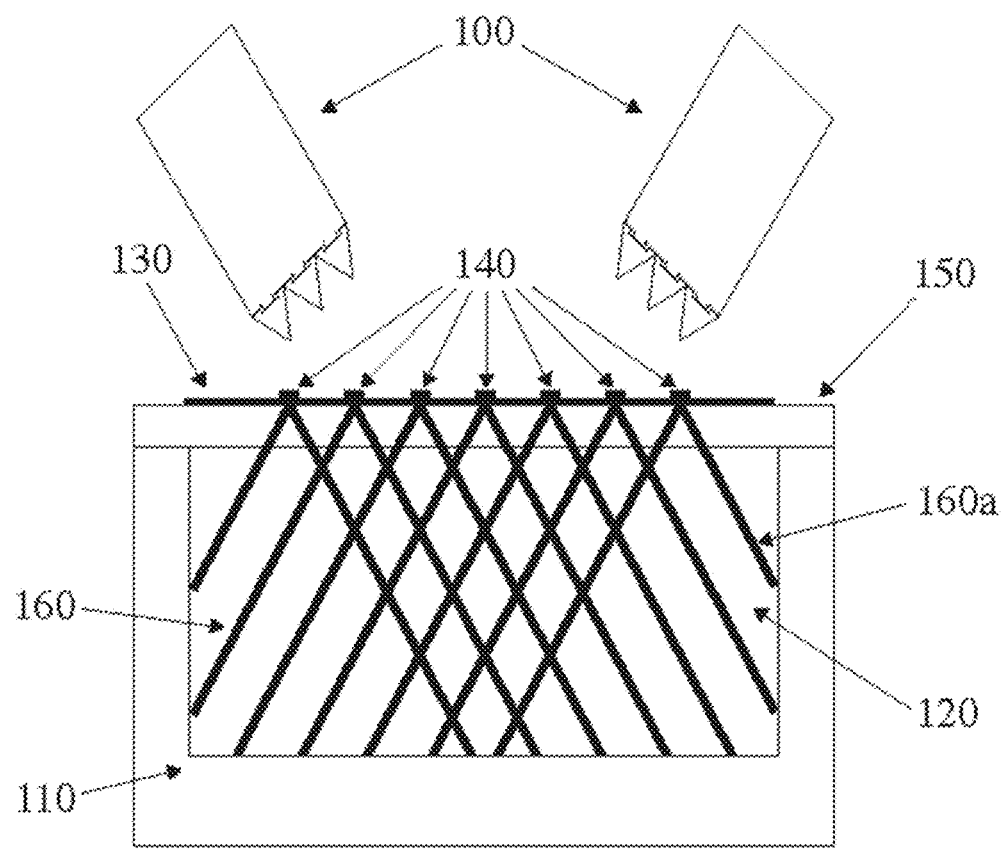
FIG. 1 is a schematic diagram of a system for forming a green state polymer micro-truss structure according to an embodiment of the present invention.

Referring to FIG. 1, in one embodiment a ceramic micro-truss material is formed by first forming a polymer micro-truss, according, for example, to a method disclosed in the '959 patent. The micro-truss material is formed by using a fixed light input (collimated UV light) to cure (polymerize) polymer optical waveguides, which can self-propagate in a three-dimensional (3D) pattern. Some liquid monomers, referred to as photomonomers, polymerize when exposed to light (e.g., UV light), and undergo a refractive index change during the polymerization process. The refractive index change can lead to a formation of polymer optical waveguides. If a monomer that is photo-sensitive is exposed to light (typically UV) under the right conditions, the initial area of polymerization, such as a small circular area, will "trap" the light and guide it to the tip of the polymerized region, further advancing that polymerized region. This process will continue, leading to the formation of a self-propagating photopolymer waveguide structure with approximately (about) the same cross-sectional dimensions along its entire length.

With reference to FIG. 1, a system for forming a 3D polymer micro-truss structure according to an embodiment of the present invention includes one or more collimated light sources 100, a reservoir (mold) 110 having a volume of photomonomer resin 120 that will polymerize at a wavelength of collimated light beams provided by the light sources 100, and a patterning apparatus, such as a mask 130 with multiple apertures (open areas) 140.

The photomonomer resin includes a pre-ceramic monomer formulation or a polymeric system (e.g., one of those disclosed in the '859 Application) that results, upon polymerization, in a pre-ceramic material that, in turn, may be pyrolyzed to form a ceramic material. In one embodiment, the pre-ceramic monomer formulation or a polymeric system includes, as a major component, a compound selected from the group consisting of siloxanes, silanes, carbosilanes, silazanes, borosilanes and combinations thereof. In one embodiment, further additives are included in the photomonomer resin; these additives (which may include fillers) may be selected from the group consisting of: yttrium, compounds of yttrium, zirconium, compounds of zirconium, aluminum, compounds of aluminum, titanium, compounds of titanium, high-temperature alloys, ceramics, boron, diamond, and combinations thereof. The ceramics may include carbides, and/or silicides, e.g., silicon carbide or magnesium silicide.

Each of the apertures 140 has a given shape and dimension substantially matching a cross section geometry of a waveguide (e.g., waveguide 160a). Between the mask 130 and the monomer 120, there may be a substrate 150. Here, in FIG. 1, a truly 3D network can be formed because the intersecting polymer waveguides 160 will simply polymerize together, but will not interfere with waveguide propagation. Also, the spacing between the plurality of waveguides 160 corresponds with the pattern of the plurality of apertures 140. The pattern of the apertures 140 may, for example, be in a square pattern or in a hexagonal pattern. The hole (aperture) diameter and spacing, in the mask 130, and the number of waveguides 160 formed from each of the apertures 140 may be adjusted to adjust the open volume fraction (i.e. open space) of the formed 3D micro-truss. These characteristics may be constant or may vary, as a result of corresponding variations in the mask hole size, shape, or spacing, across the micro-truss structure.

When a micro-truss structure has been formed within the reservoir of photomonomer, the micro-truss structure may be removed from the reservoir, and the excess photomonomer may be allowed to drain off of the micro-truss structure. In one embodiment the micro-truss structure is extracted from the reservoir and cleaned utilizing a hot air process. Hot air, e.g., air between 30° C. to 120° C., is blown over the micro-truss structure with a pressure 5 pounds per square inch gauge (PSI gauge) to 100 PSI gauge to remove excess photomonomer resin. During this process the micro-truss structure can be suspended over a porous support such as a grate to allow resin to drop away or on a porous support such as paper towels to absorb the excess resin. In this state the micro-truss structure is referred to as a green state polymer micro-truss structure, which may be flexible and amenable to being molded or shaped.

Figure 2:
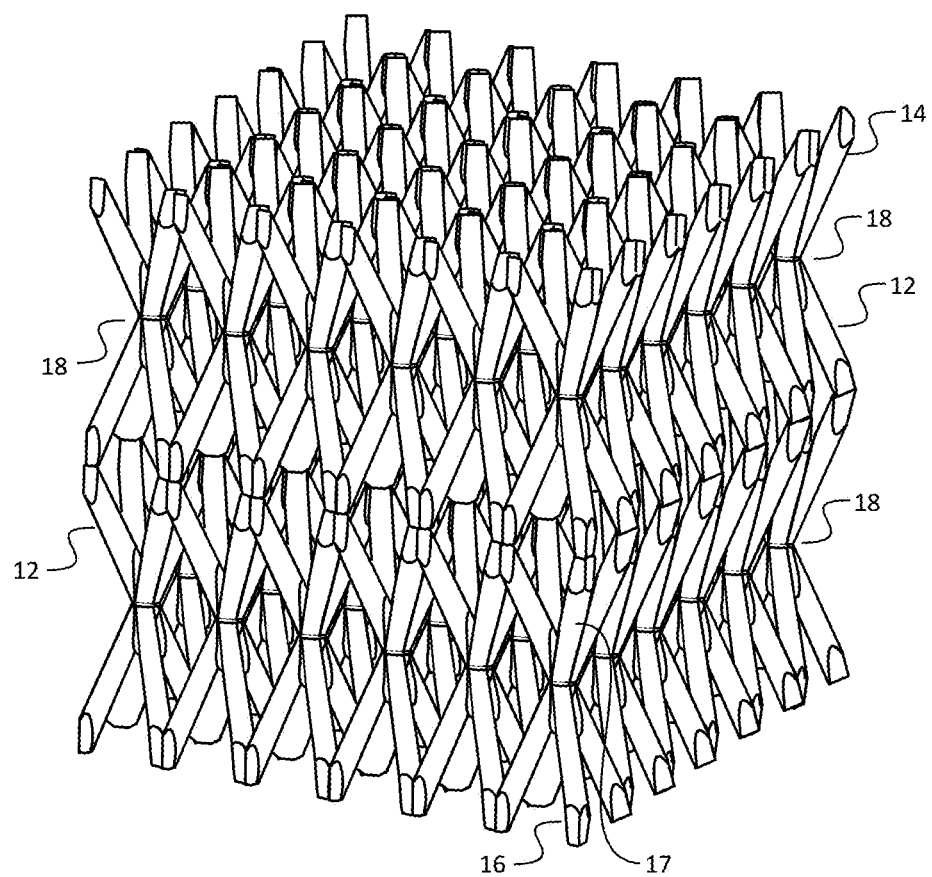
FIG. 2 is a perspective view of a green state polymer micro-truss structure according to an embodiment of the present invention.
Figure 3:
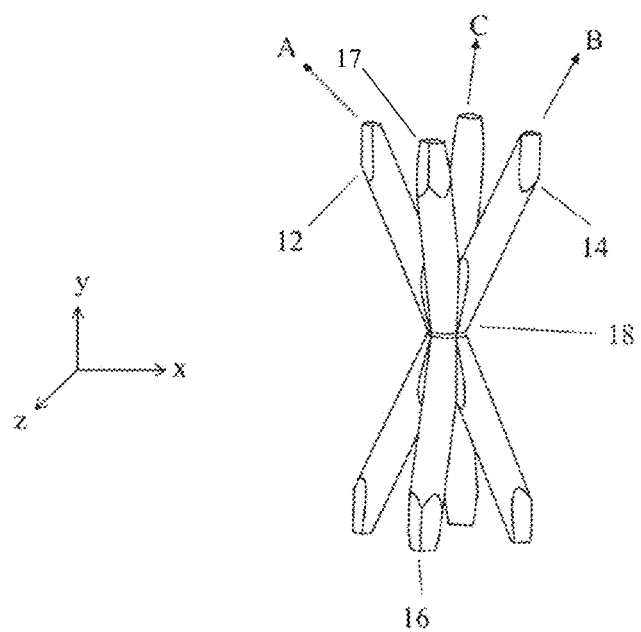
FIG. 3 is a perspective view of a portion of a green state polymer micro-truss structure according to an embodiment of the present invention.

Referring to FIGS. 2 and 3, the small-scale "primary" shape of the micro-truss structure includes first truss elements (or truss members) 12, second truss elements 14, and third truss elements 16. The first truss elements 12 are defined by first self-propagating polymer waveguides and extend along a first direction A. The second truss elements 14 are defined by second self-propagating polymer waveguides and extend along a second direction B. The third truss elements 16 are defined by third self-propagating polymer waveguides and extend along a third direction C. Additional sets of truss elements, e.g., fourth truss elements 17 may also be present. With reference to FIGS. 2 and 3, the truss elements 12, 14, 16, and 17 interpenetrate each other at nodes 18 to form a continuous periodic material. Each truss member may have a circular cross sections as shown in FIGS. 2 and 3 or they may have another, essentially arbitrary cross section, e.g., polygonal, or elongated. An elongated cross section may have a major axis in its longest dimension and a perpendicular minor axis with a corresponding minor dimension.

Figure 4:
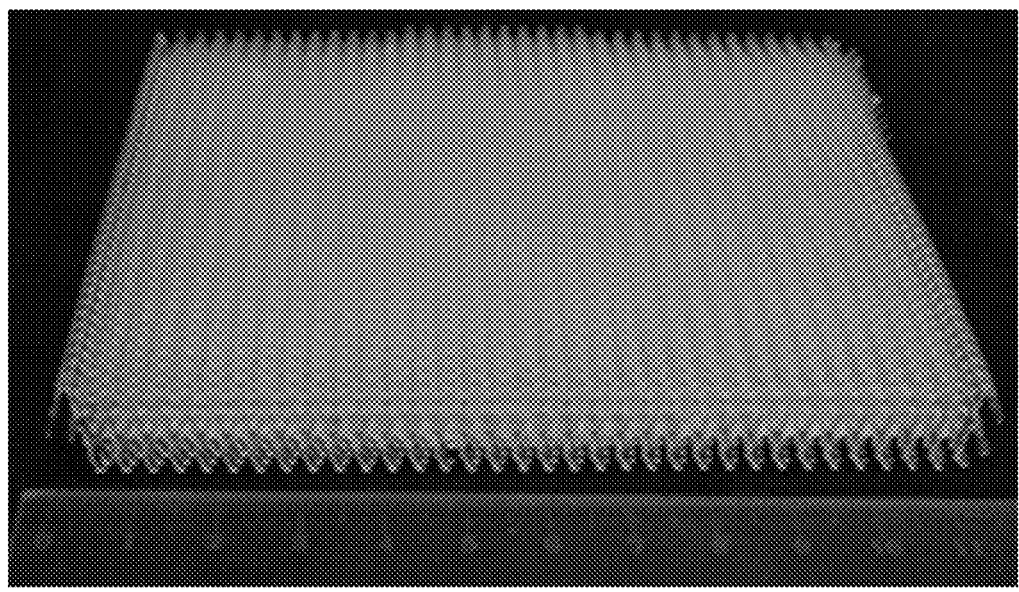
FIG. 4 is a photograph of a green state polymer micro-truss structure according to an embodiment of the present invention.

FIG. 4 shows an exemplary micro-truss structure formed by this method. In the embodiment of FIG. 4, the local, small-scale or "primary" shape is that of a micro-truss structure, as illustrated in FIGS. 2 and 3, and the large scale or "secondary" shape is that of flat sheet, with a thickness that is small relative to the length and width of the sheet. The outer surface, or envelope of the structure defines the secondary shape. As used herein, the "envelope" of a micro-truss structure is a hypothetical surface that is smooth on the scale of the micro-truss unit cell and fits closely around the structure. As mentioned above, the structure of FIG. 4 may be referred to as a flat sheet; a sheet may also be curved. A "sheet", as used herein, is a shape having two major surfaces, the two major surfaces constituting at least 50% of the total surface area of the shape, the two major surfaces being locally substantially parallel, and the local separation between the two surfaces, or "thickness" of the sheet, being substantially constant, the radius of curvature at any point on either of the major surfaces being at least three times the thickness.

Figure 5:
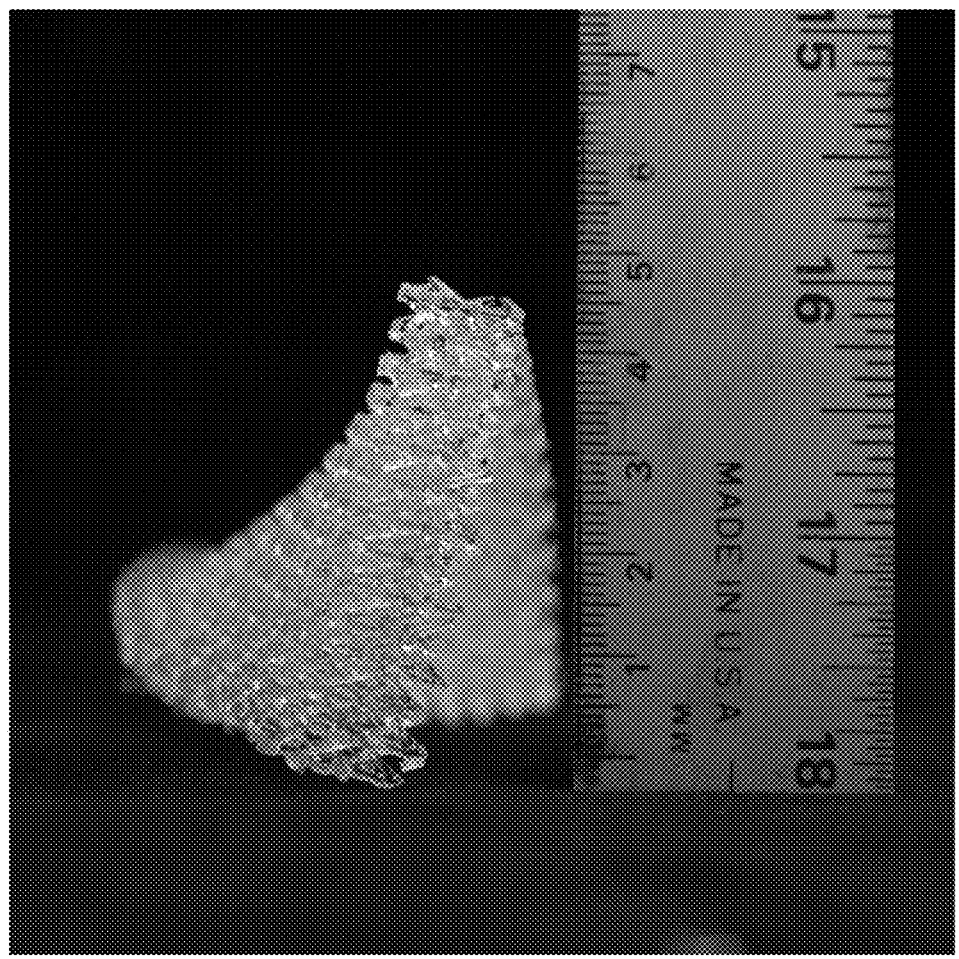
FIG. 5 is a photograph of a shaped, cured polymer micro-truss structure according to an embodiment of the present invention.

Referring to FIG. 5, the green state polymer micro-truss structure may be molded or shaped to form a shape different from the flat sheet of FIG. 4. This may be accomplished, e.g., by placing the green state polymer micro-truss structure into a suitable mold composed of two halves, and pressing the halves together with enough force to cause the green state polymer micro-truss structure to assume the shape of the space left between the halves. In other embodiments the green state polymer micro-truss structure may be shaped by hand or using tools, or the green state polymer micro-truss structure may be draped over a curved surface and caused by gravity to conform to the surface. In other embodiments green state polymer micro-truss structure is shaped by a process selected from the group consisting of bending, stretching, impressing, embossing and combinations thereof. Additional shaping methods may include one or more of cutting, piercing, and compressing. In one embodiment, a green state polymer micro-truss structure in the shape of a flat sheet is molded, e.g., using a conical or cylindrical mold, into a shape that has an envelope, a portion of which is conical or tubular.

Once the green state polymer micro-truss structure has been shaped, it may be post-cured while being held in place, e.g., by again exposing the green state polymer micro-truss structure to ultraviolet (UV) light, or by heating it in an inert environment. For UV light curing, the green state polymer micro-truss structure may for example be exposed to UV light with an irradiance of about 100 mW/cm$^2$ for 2 minutes in the active range of the resin formulation. To post-cure the green state polymer micro-truss structure using heat, it may for example be heated to above 120° C. in vacuum or nitrogen atmosphere. A post-cure process using UV light may be followed by a second post-cure process using heat. The post-curing process completes the crosslinking of the monomers forming the micro-truss structure. Once post-cured, the micro-truss structure is referred to as a cured polymer micro-truss structure, and it may be sufficiently rigid to reliably hold its shape. The green state polymer micro-truss structure or the cured polymer micro-truss structure may also be machined (i.e., it may be cut, milled, drilled, or processed by other machining processes known to those of skill in the art).

In one embodiment, the cured polymer micro-truss structure may be pyrolyzed to form a ceramic micro-truss structure. The cured polymer micro-truss structure is placed on a flat high-temperature-safe substrate, such as graphite (e.g., sanded graphite) or alumina, which has been lubricated. The cured polymer micro-truss structure may shrink during pyrolysis, and the lubricant may allow easy sliding of the cured polymer micro-truss structure's contact points with the substrate during pyrolysis. The lubricant may be graphite powder or boro-nitride powder, for example. It may not be necessary to use a high temperature mold or mandrel to constrain the cured polymer micro-truss structure during pyrolysis.

In one embodiment, the cured polymer micro-truss structure is placed in the furnace and the furnace is sealed. The furnace includes an inlet port for inert gas and a port for exhaust. The pyrolysis process may generate a significant amount of organic compounds and exhaust gases (e.g., methane, carbon monoxide, carbon dioxide, and hydrogen) which may be purged and vented. The furnace may be fed an inert gas such as argon or nitrogen, or an inert gas mixture, at a rate sufficient to maintain the inert environment in the furnace, and to maintain an atmospheric oxygen concentration sufficiently low to prevent significant oxidation from occurring. As used herein, an "inert" environment or gas mixture is one that results in negligible excess mass loss during pyrolysis. The adequacy of the purge gas flow may be verified by any of several methods understood by those of skill in the art. For example, a sample of the polymer to be pyrolyzed may be analyzed with thermogravimetric analysis (TGA) to determine the fractional mass loss to be expected during pyrolysis. A sample of polymer micro-truss may then be pyrolyzed in the furnace. Any excess mass loss, i.e., higher mass loss during pyrolysis than during TGA, may indicate that the purge is inadequate or not inert, whereas a similar fractional mass loss may indicate adequate purging. In another example, analysis of exhaust gas may be used to determine the composition of the exhaust purge gas prior to or during pyrolysis, and oxygen levels may be detected, and an assessment made as to whether they are sufficiently low enough to prevent oxidation.

Figure 6:
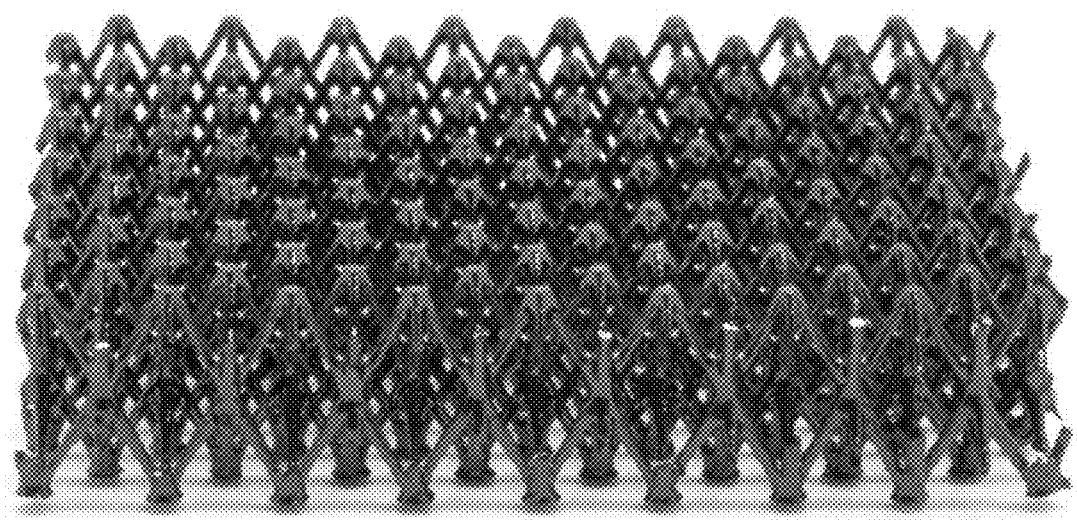
FIG. 6 is a photograph of a ceramic micro-truss structure according to an embodiment of the present invention.
Figure 7:
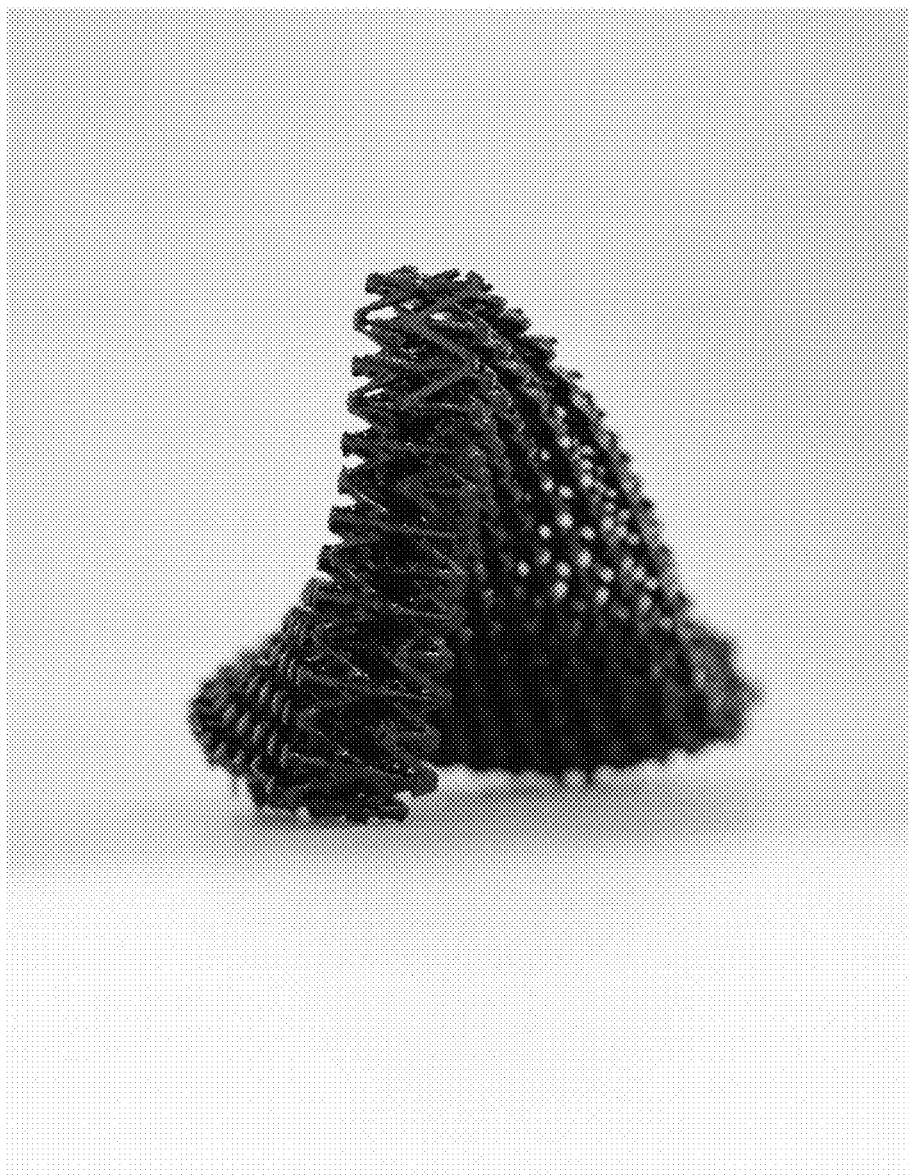
FIG. 7 is a photograph of a shaped ceramic micro-truss structure according to an embodiment of the present invention.

The heating profile of the furnace may be kept below 40° C. per minute, e.g., below 3° C. per minute. During pyrolysis the cured polymer micro-truss structure may lose mass and volume, while maintaining its original shape. Slower temperature ramps allow for slower evolution of exhaust gases and prevent rapid gas expansion in the material; rapid gas expansion may crack, damage, or destroy the structure. The open cellular architecture of the cured polymer micro-truss structure may allow gas to easily escape preventing cracks from forming and allowing for fully dense structure to be formed. The peak temperature during pyrolysis may be at least 600° C. and no more than 1500° C. to create an amorphous ceramic material. The micro-truss structure may be held at the peak temperature for at least two minutes, e.g., for one hour or more. To complete the pyrolysis process, the furnace may then be cooled to room temperature at a rate sufficiently low to prevent cracking from thermal gradient stresses, e.g., at a rate of 3° C. per minute. The shrinkage and mass loss that occurs during pyrolysis are dependent on the polymer formulation of the cured polymer micro-truss structure. FIGS. 6 and 7 show ceramic micro-truss structures resulting from the pyrolysis of (i) a cured polymer micro-truss structure in the shape of a flat sheet (FIG. 6) and (ii) a cured polymer micro-truss structure in the shape of a curved sheet (FIG. 7).

The composition of the ceramic micro-truss structure may include, as a major component, a ceramic including, as a major component, a combination of at least two elements selected from the group consisting of silicon, carbon, nitrogen, oxygen, boron, and aluminum.

Figure 8A:
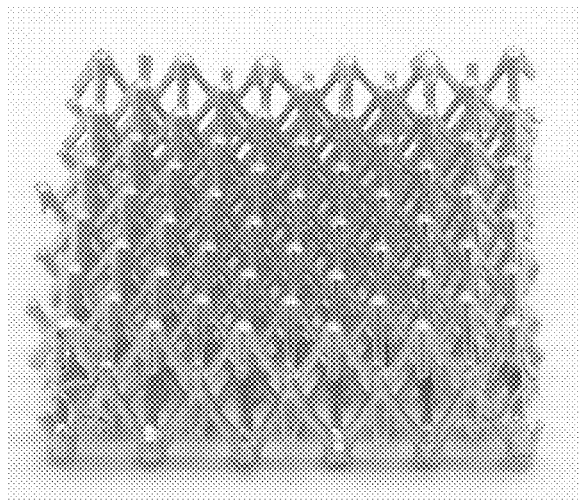
FIG. 8A is a photograph of a metal-coated ceramic micro-truss structure according to an embodiment of the present invention.
Figure 8B:
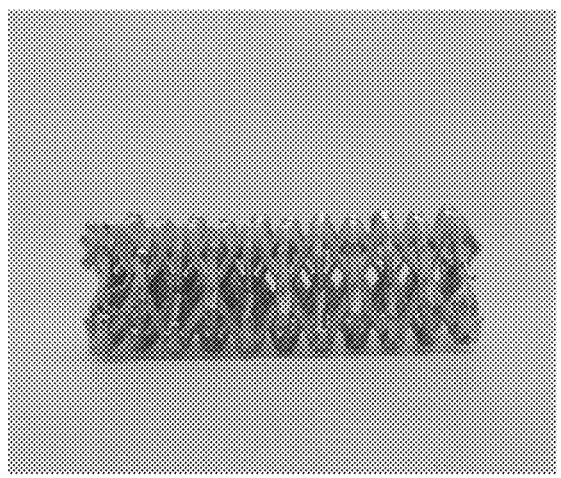
FIG. 8B is a photograph of another view of the metal-coated ceramic micro-truss structure of FIG. 8A.
Figure 9A:
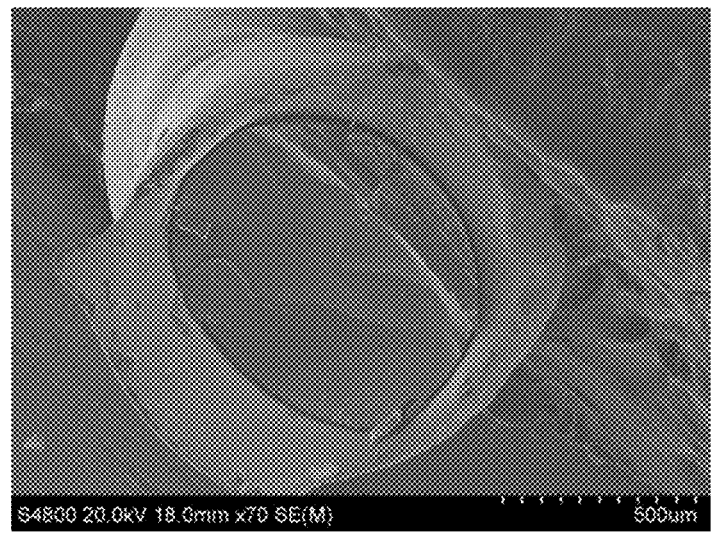
FIG. 9A is a photomicrograph of a cross section of a truss member of a metal-coated ceramic micro-truss structure according to an embodiment of the present invention.
Figure 9B:
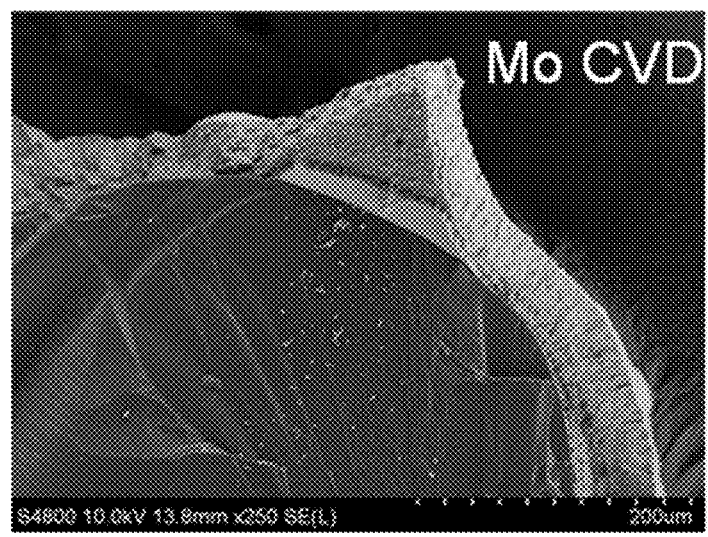
FIG. 9B is a photomicrograph of a cross section of a truss member of a metal-coated ceramic micro-truss structure according to another embodiment of the present invention.
Figure 10:
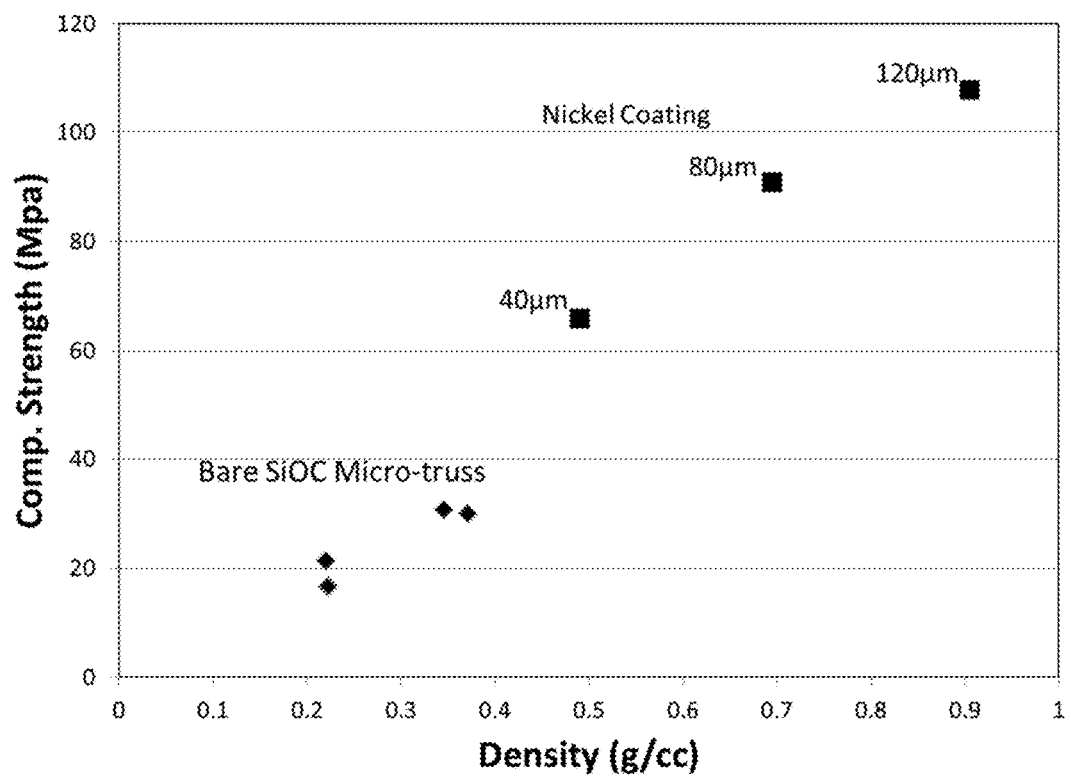
FIG. 10 is a chart of compressive strength as a function of density for different micro-truss structures according to embodiments of the present invention.
Figure 11:
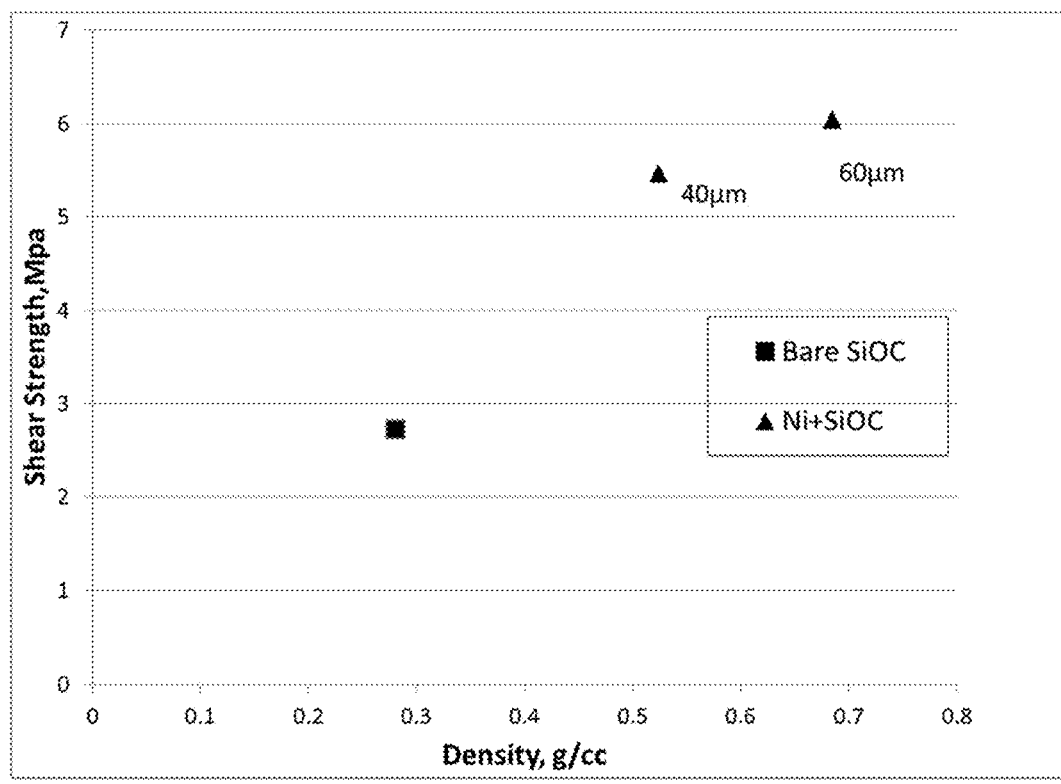
FIG. 11 is a chart of shear strength as a function of density for different micro-truss structures according to embodiments of the present invention.

Referring to FIGS. 8A and 8B, a coating of metal can be applied to the surface of the ceramic micro-truss structure, forming a metal-coated ceramic micro-truss structure. The metal coating may be any metal which can be deposited across the structure, and it may be deposited using processes such as sputtering, chemical vapor deposition (CVD), plasma spray, chemical vapor infiltration (CVI), physical vapor deposition (PVD), evaporation, electroless plating, or electroplating. The metal-coated ceramic micro-truss may have improved characteristics compared to the uncoated ceramic micro-truss, e.g., the toughness, chemical resistances, thermal resistance, and strength may be improved, as may be the surface compatibility for processing, such as wetting for casting. FIGS. 8A and 8B show a metal-coated ceramic micro-truss structure in which the metal coating consists of 1000 angstroms of titanium, 1000 angstroms of nickel, and 40 microns of electroplated nickel. FIGS. 9A and 9B show cross sections of a truss member of metal-coated ceramic micro-truss structures in which the metal coating is nickel and molybdenum, respectively. A thin ductile metal coating may interact synergistically with a brittle ceramic micro-truss core and the result may be a substantial increase in the strength of the resulting metal-coated ceramic micro-truss, which is a metal-ceramic hybrid material. The observed increase in strength is larger than expected from the additional load carrying capability of the metal coating. FIGS. 10 and 11 show comparisons of bare and nickel plated ceramic micro-truss structures during compression and shear testing and the improved response from the nickel-plated material.

Figure 12A:
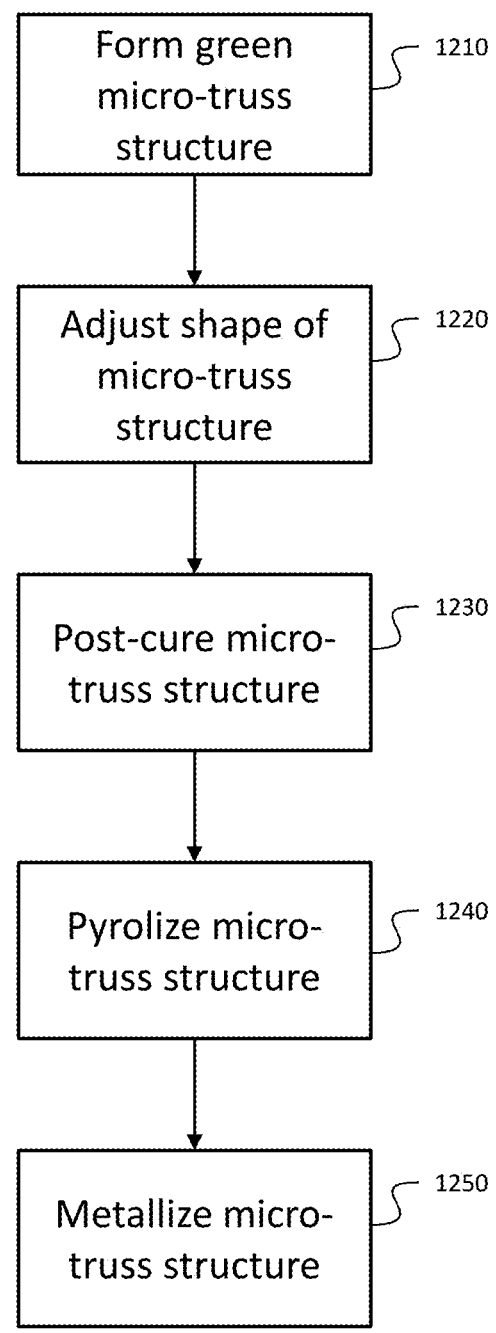
FIG. 12A is a flow chart illustrating a method of forming a micro-truss structure according to an embodiment of the present invention.
Figure 12B:
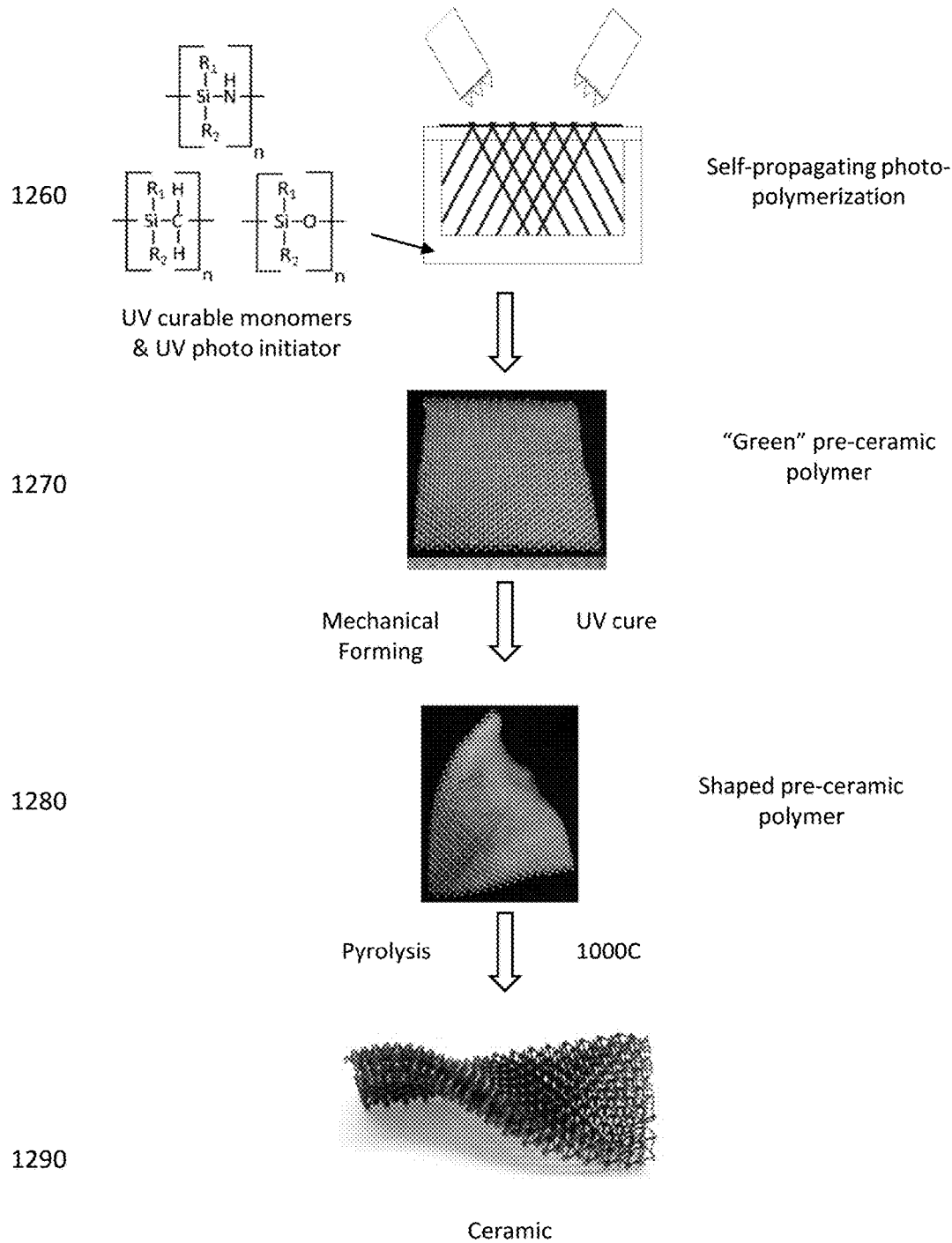
FIG. 12B is an illustrated sequence showing steps and intermediate products corresponding to the embodiment of FIG. 12A.

Referring to FIGS. 12A and 12B, in one embodiment a method for forming a micro-truss structure includes: in an act 1210 (or 1260), forming a green state polymer micro-truss structure 1270, in an act 1220, adjusting the shape of the green state polymer micro-truss structure, in an act 1230, post-curing the green state polymer micro-truss structure to form a cured polymer micro-truss structure (or "cured shaped pre-ceramic polymer" 1280), in an act 1240, pyrolyzing the cured polymer micro-truss structure to directly form a ceramic micro-truss structure 1290, and, in an act 1250, metallizing the ceramic micro-truss structure to form a metal-coated ceramic micro-truss structure.

Example 1

Figure 13:
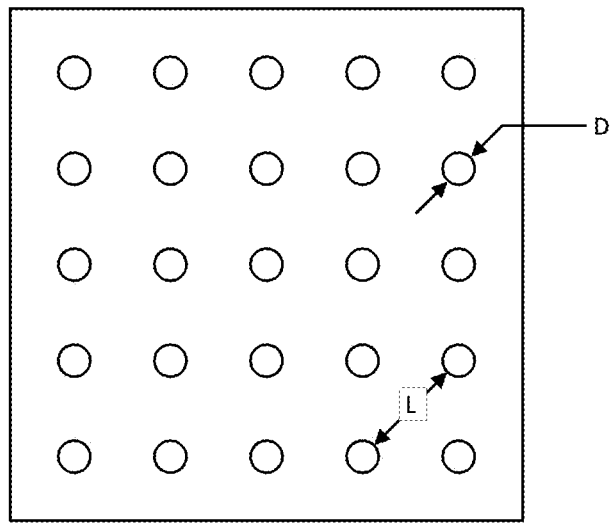
FIG. 13 is a diagram illustrating the geometry of a mask used to form a micro-truss structure according to an embodiment of the present invention.
Figure 14:
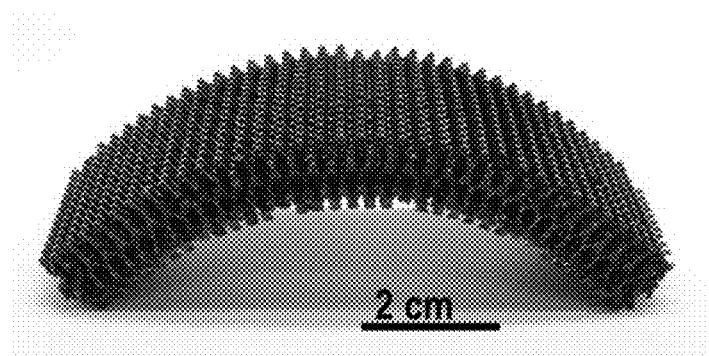
FIG. 14 is a photograph of a shaped ceramic micro-truss structure according to an embodiment of the present invention.

In a first example, a mask with the geometry illustrated in FIG. 13, with hole diameters D of 0.8 mm and diagonal hole spacing L of 4.8 mm was used. FIG. 13 illustrates the geometry of the mask only; the mask used in this example included a larger number of holes than are shown in FIG. 13. A green state polymer micro-truss structure was formed by exposing a photomonomer to UV light with an irradiance of collimated 14 $mW/cm^2$ for an exposure time of 90 seconds. A 5"×5" piece of green state polymer micro-truss was formed in this manner. The green state polymer micro-truss structure was cleaned using hot air on an absorbent pad. The 5"×5" piece of green state polymer micro-truss was then cut down to make a 2"×4.5" piece of green state polymer micro-truss. This 2"×4.5" piece of green state polymer micro-truss was molded around a glass dish to create a curved shape, UV post-cured for 2 minutes using a Fusion Box with an H+ bulb, and then subjected to a thermal post-cure (i.e., a post-cure using heat) at 160° C. in a vacuum oven, to form a cured polymer micro-truss structure. The cured polymer micro-truss structure was pyrolyzed on a graphite sheet in a furnace purged with argon at a flow rate of about 100 ml/minute to 500 ml/minute, at a pressure of less than 5 PSI gauge (i.e., a pressure exceeding atmospheric pressure by less than 5 PSI). The temperature was ramped up at a rate of 1° C./minute to 1000° C., and held at 1000° C. for one hour. The temperature was then ramped back down, at a rate of 3° C./minute to 25° C. The resulting ceramic micro-truss structure is shown in FIG. 14. Mass loss during pyrolysis was 45% of the cured polymer micro-truss structure mass, and the dimensional shrinkage during pyrolysis was 30%.

Example 2

Figure 15A:
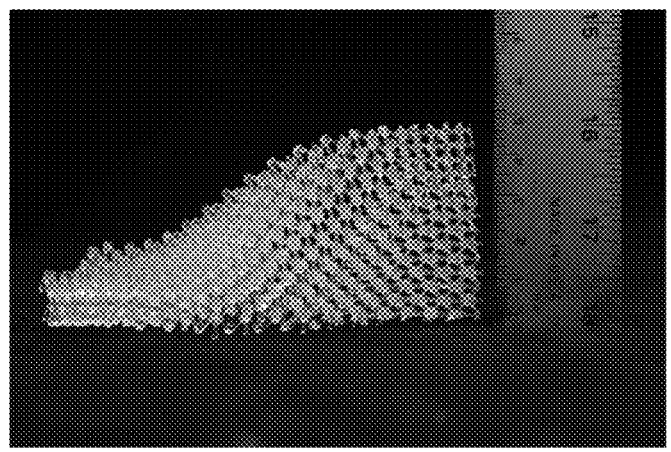
FIG. 15A is a photograph of a shaped, cured polymer micro-truss structure according to an embodiment of the present invention.
Figure 15B:
FIG. 15B is a photograph of another view of the shaped, cured polymer micro-truss structure of FIG. 15A.
Figure 15C:
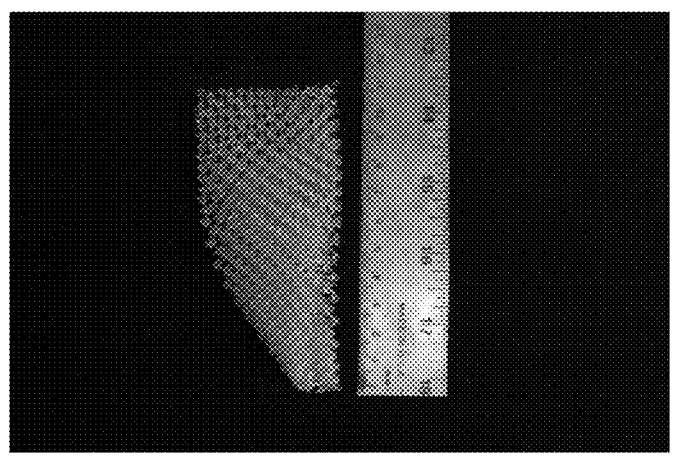
FIG. 15C is a photograph of yet another view of the shaped, cured polymer micro-truss structure of FIG. 15A.
Figure 16A:
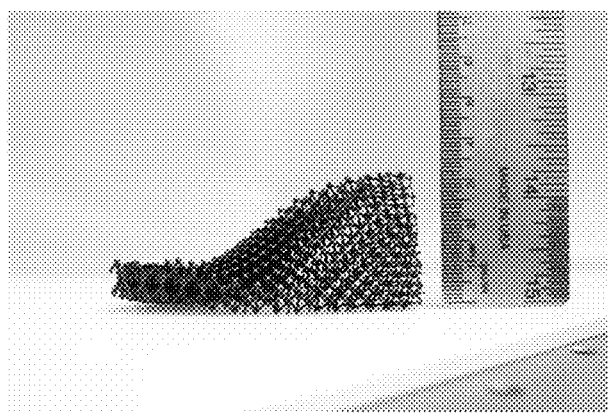
FIG. 16A is a photograph of a shaped ceramic micro-truss structure according to an embodiment of the present invention.
Figure 16B:
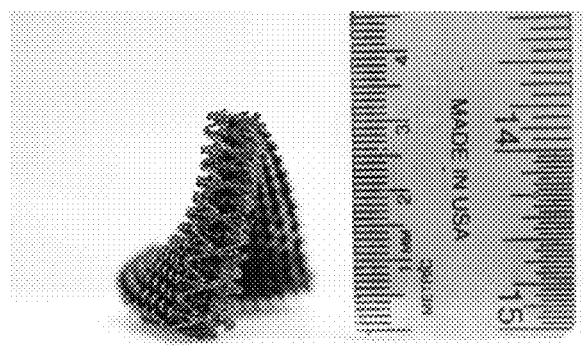
FIG. 16B is a photograph of another view of the shaped ceramic micro-truss structure of FIG. 16A.
Figure 16C:
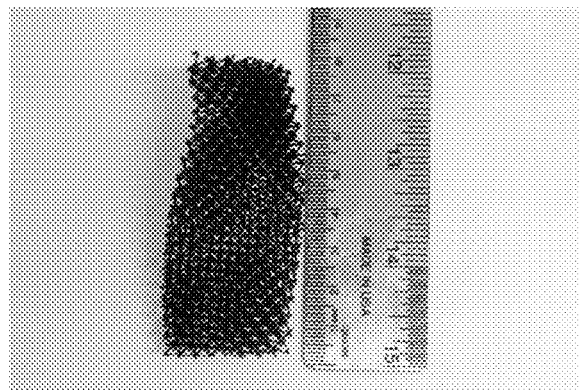
FIG. 16C is a photograph of yet another view of the shaped ceramic micro-truss structure of FIG. 16A.

In a second example, a mask with the geometry illustrated in FIG. 13, with hole diameters D of 1 mm and diagonal hole spacing L of 7.2 mm was used. FIG. 13 illustrates the geometry of the mask only; the mask used in this example included a larger number of holes than are shown in FIG. 13. A green state polymer micro-truss structure was formed by exposing a photomonomer to UV light with an irradiance of 14 $mW/cm^2$ for an exposure time of 90 seconds. A 5"×5" piece of green state polymer micro-truss was formed in this manner. The green state polymer micro-truss structure was cleaned using hot air on an absorbent pad. The 5"×5" piece of green state polymer micro-truss was then cut down to make a 2"×4.5" piece of green state polymer micro-truss. This 2"×4.5" piece of green state polymer micro-truss was molded by hand to form a twist shape with 90° of twist, UV post-cured for 1 minute using 14 $mW/cm^2$ UV, then UV post-cured for 2 minutes using a higher power UV, about 100 $mW/cm^2$, to form a cured polymer micro-truss structure, which is shown in FIGS. 15A, 15B, and 15C. The cured polymer micro-truss structure was pyrolyzed on a graphite sheet in a furnace purged with argon at a flow rate of about 100 ml/minute to 500 ml/minute, at a pressure of less than 5 PSI gauge (i.e., a pressure exceeding atmospheric pressure by less than 5 PSI). The temperature was ramped up at a rate of 1° C./minute to 1000° C., and held at 1000° C. for one hour. The temperature was then ramped back down, at a rate of 3° C./minute to 25° C. The resulting ceramic micro-truss structure is shown in FIGS. 16A, 16B, and 16C. Mass loss during pyrolysis was 45% of the cured polymer micro-truss structure mass, and the dimensional shrinkage during pyrolysis was 30%.

The ceramic composition of the ceramic micro-truss structures of each of Example 1 and Example 2 was analyzed using inductively coupled plasma mass spectrometry (ICP-MS) and determined, in each case, to be: silicon: 27 atomic percent (at. %), oxygen: 36 at. %, carbon: 33 at. %, and sulfur: 4 at. %.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration.

As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although limited embodiments of a net shape ceramic microtruss and ceramic microtruss with metal shell have been specifically described and illustrated herein, many modifications and variations will be apparent to those skilled in the art. Accordingly, it is to be understood that a net shape ceramic microtruss and ceramic microtruss with metal shell employed according to principles of this invention may be embodied other than as specifically described herein. The invention is also defined in the following claims, and equivalents thereof.

What is claimed is:

1. A micro-truss structure, comprising:
    a plurality of first truss members extending along a first direction; and
    a plurality of second truss members extending along a second direction,
    wherein the first and second truss members interpenetrate each other at a plurality of nodes to form a continuous material;
    wherein each of the truss members comprises as a major component a ceramic comprising, as a major component, a combination of at least two elements selected from the group consisting of silicon, carbon, nitrogen, oxygen, boron, and aluminum;
    wherein the ceramic further comprises sulfur at a concentration of between 0.01 atomic percent (at. %) and 20 at. %; and
    wherein each of the truss members comprises an exterior metal coating with a thickness of at least 100 nanometers (nm).

2. The micro-truss structure of claim 1, wherein each of the truss members further comprises an additive selected from the group consisting of: yttrium, compounds of yttrium, zirconium, compounds of zirconium, aluminum, compounds of aluminum, titanium, compounds of titanium, high-temperature alloys, ceramics, boron, diamond, silicides, and combinations thereof.

3. The micro-truss structure of claim 1, wherein a cross section of a truss member of the plurality of first truss members and the plurality of second truss members has a cross-sectional shape selected from the group consisting of a circle, a polygon, and an elongated shape with a minor dimension of less than 4 mm.

4. The micro-truss structure of claim 1, wherein a truss member of the plurality of first truss members and the plurality of second truss members has a circular cross section with a diameter between 0.01 mm and 3 mm.

5. The micro-truss structure of claim 1, wherein the ceramic comprises, as a major component, a substance selected from the group consisting of silicon, carbon, oxygen, and combinations thereof.

6. The micro-truss structure of claim 1, wherein a truss member of the plurality of first truss members and the plurality of second truss members has a diameter greater, by at least 30%, than another truss member of the plurality of first truss members and the plurality of second truss members.

7. The micro-truss structure of claim 1, further comprising a plurality of third truss members extending along a third direction,
wherein the first, second, and third truss members interpenetrate each other at a plurality of nodes to form a continuous material.

8. A micro-truss structure, comprising:
a plurality of first truss members extending along a first direction; and
a plurality of second truss members extending along a second direction,
wherein the first and second truss members interpenetrate each other at a plurality of nodes to form a continuous material;
wherein each of the truss members comprises as a major component a ceramic comprising, as a major component, a combination of at least two elements selected from the group consisting of silicon, carbon, nitrogen, oxygen, boron, and aluminum; and
wherein the structure has an envelope in the shape of a curved sheet, a radius of curvature at a point on the envelope being more than 3 times the thickness of the sheet and less than 100 times the thickness of the sheet,
wherein the ceramic further comprises sulfur at a concentration of between 0.01 atomic percent (at. %) and 20 at. %.

9. The micro-truss structure of claim 8, wherein a portion of the envelope is conical or tubular.

10. The micro-truss structure of claim 8, further comprising a plurality of third truss members extending along a third direction,
wherein the first, second, and third truss members interpenetrate each other at a plurality of nodes to form a continuous material.

* * * * *